US012637766B2

(12) United States Patent
Tsuji

(10) Patent No.: US 12,637,766 B2
(45) Date of Patent: May 26, 2026

(54) SUBSTRATE PROCESSING APPARATUS WITH FLOW CONTROL RING, AND SUBSTRATE PROCESSING METHOD

(71) Applicant: ASM IP Holding B.V., Almere (NL)

(72) Inventor: Naoto Tsuji, Tokyo (JP)

(73) Assignee: ASM IP Holding B.V., Almere (NL)

( * ) Notice: Subject to any disclaimer, the term of this patent is extended or adjusted under 35 U.S.C. 154(b) by 149 days.

(21) Appl. No.: 17/670,030

(22) Filed: Feb. 11, 2022

(65) Prior Publication Data

US 2022/0259731 A1 Aug. 18, 2022

Related U.S. Application Data

(60) Provisional application No. 63/150,082, filed on Feb. 16, 2021.

(51) Int. Cl.
| | |
|---|---|
| *C23C 16/455* | (2006.01) |
| *C23C 16/458* | (2006.01) |
| *H01L 21/20* | (2006.01) |
| *H01L 21/67* | (2006.01) |
| *H10P 14/20* | (2026.01) |
| *H10P 72/00* | (2026.01) |

(52) U.S. Cl.
CPC .. *C23C 16/45536* (2013.01); *C23C 16/45508* (2013.01); *C23C 16/45565* (2013.01); *C23C 16/4585* (2013.01); *H10P 14/20* (2026.01); *H10P 72/0421* (2026.01)

(58) Field of Classification Search
None
See application file for complete search history.

(56) References Cited

U.S. PATENT DOCUMENTS

| | | | |
|---|---|---|---|
| 5,338,363 A | | 8/1994 | Kawata et al. |
| 6,074,518 A | | 6/2000 | Imafuku et al. |
| 6,077,353 A | * | 6/2000 | Al-Sharif .......... H01L 21/67069 |
| | | | 269/21 |
| 6,109,730 A | | 8/2000 | Nilsson et al. |
| 8,215,264 B2 | | 7/2012 | Hong |
| 9,243,326 B2 | | 1/2016 | Jiang et al. |
| 9,514,951 B2 | | 12/2016 | Kaneda et al. |
| 9,673,092 B2 | | 6/2017 | Nakano |
| 9,879,342 B2 | | 1/2018 | Kim |
| 10,662,525 B2 | | 5/2020 | Jang |
| 10,692,741 B2 | | 6/2020 | Verbaas |
| 10,755,902 B2 | | 8/2020 | Kishi et al. |

(Continued)

FOREIGN PATENT DOCUMENTS

| | | |
|---|---|---|
| JP | H08264515 A | 10/1996 |
| JP | 2004221266 A | 8/2004 |
| JP | 2013067844 A | 4/2013 |

*Primary Examiner* — Jeffrie R Lund
*Assistant Examiner* — Tiffany Z Nuckols
(74) *Attorney, Agent, or Firm* — Snell & Wilmer L.L.P.

(57) ABSTRACT

Examples of a substrate processing apparatus includes a chamber, a susceptor provided in the chamber, a shower head provided above the susceptor, and a flow control ring having a shape to surround the susceptor, the flow control ring having a first top surface and a second top surface that has an annular shape and is provided closer to an inner edge of the flow control ring than the first top surface at a higher level than the first top surface, the second top surface being a sloped surface whose height decreases toward the first top surface.

19 Claims, 5 Drawing Sheets

(56)          References Cited

U.S. PATENT DOCUMENTS

| | | | | |
|---|---|---|---|---|
| 10,822,695 | B2 | 11/2020 | Jang | |
| 10,950,449 | B2 | 3/2021 | Adachi | |
| 11,492,705 | B2 * | 11/2022 | Pathak | ................ C23C 16/4408 |
| 12,480,210 | B2 | 11/2025 | Madsen | |
| 2012/0009765 | A1 * | 1/2012 | Olgado | ............ C23C 16/45565 |
| | | | | 257/E21.09 |
| 2012/0309175 | A1 * | 12/2012 | Masumura | .............. C30B 25/12 |
| | | | | 257/E21.09 |
| 2017/0047233 | A1 * | 2/2017 | Kaneda | ................. H01L 21/311 |
| 2018/0261453 | A1 | 9/2018 | Ghosh et al. | |
| 2019/0122872 | A1 * | 4/2019 | Ghosh | ................ C23C 16/4408 |
| 2019/0221432 | A1 * | 7/2019 | Adachi | ................ C23C 16/042 |
| 2020/0126840 | A1 | 4/2020 | Roh | |
| 2020/0176244 | A1 | 6/2020 | Lee | |
| 2021/0035786 | A1 | 2/2021 | Jeong et al. | |
| 2021/0156024 | A1 | 5/2021 | Roh | |

* cited by examiner

| Recipe | | Particle R1 | R2 | Particle R3 | R4 |
|---|---|---|---|---|---|
| Inert gas 1 | [slm] | 0 | 0 | 2.5 | 0 |
| Carrier gas 1 | [slm] | 2 | 1 | 2 | 2 |
| Carrier gas 2 | [slm] | 2 | 1 | 2 | 2 |
| Oxidation gas | [slm] | 3 | 5.4 | 0.6 | 1.8 |
| Inert gas 2 | [slm] | 4 | 0 | 4 | 4 |
| Seal gas | [slm] | 1.8 | 1.8 | 1.8 | 1 |
| RC Press | [mTorr] | 2500 | 2500 | 2500 | 2000 |
| HRF | [W] | 470 | 475 | 475 | 15 |
| Gap | [mm] | 7.5 | 10.5 | 7.5 | 10.5 |

SUBSTRATE PROCESSING APPARATUS WITH FLOW CONTROL RING, AND SUBSTRATE PROCESSING METHOD

CROSS-REFERENCE TO RELATED APPLICATIONS

This application claims the benefit of and priority to U.S. Provisional Patent Application Ser. No. 63/150,082 filed Feb. 16, 2021, the disclosure of which is hereby incorporated by reference in its entirety.

FIELD

Examples are described which relate to a substrate processing apparatus with a flow control ring.

BACKGROUND

In the plasma enhanced atomic layer deposition (PEALD), for example, a flow control ring (FCR) is used. An FCR is a ring provided to surround a susceptor. Gas used for processing of the substrate on the susceptor is guided by the FCR to the exhaust duct. If there is a constant vortex at the height difference between the susceptor and the FCR during the process, particles can be trapped and then deposited on the surface of the periphery after the process ends. For example, particles are deposited on the inner wall of the chamber, the susceptor, the FCR, the exhaust duct or the shower head. Such particles can be stirred up when the gate valve is opened, and be deposited on the wafer.

SUMMARY

Some examples described herein may address the above-described problems. Some examples described herein may provide a substrate processing apparatus and a substrate processing method that can reduce the contamination of a substrate.

In some examples, a substrate processing apparatus includes a chamber, a susceptor provided in the chamber, a shower head provided above the susceptor, and a flow control ring having a shape to surround the susceptor, the flow control ring having a first top surface and a second top surface that has an annular shape and is provided closer to an inner edge of the flow control ring than the first top surface at a higher level than the first top surface, the second top surface being a sloped surface whose height decreases toward the first top surface.

DETAILED DESCRIPTION

Figure 1:
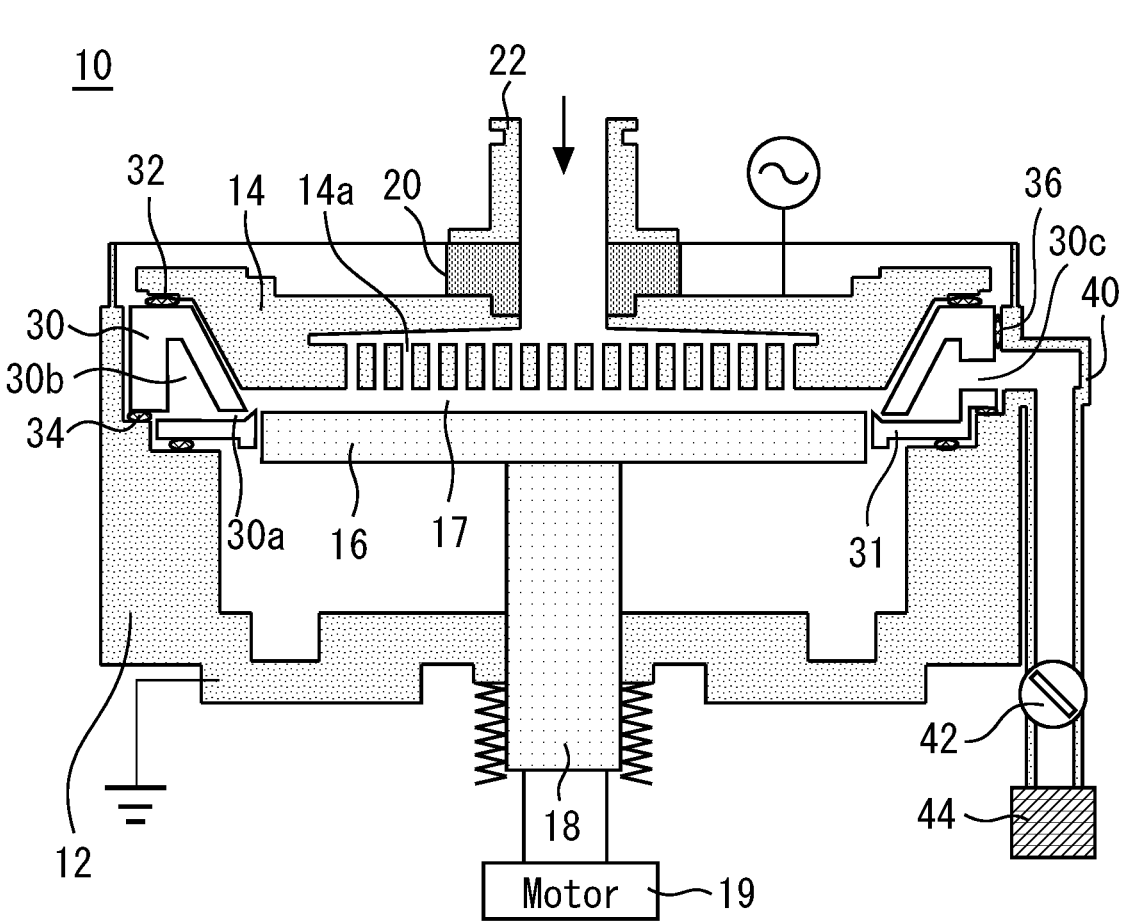
FIG. 1 is a cross-sectional view showing an example of a configuration of a substrate processing apparatus.

A substrate processing apparatus and a substrate processing method will be described with reference to the drawings. The same or corresponding components are denoted by the same reference numerals, and redundant descriptions thereof may be omitted.

FIG. 1 is a cross-sectional view showing an example of a configuration of a substrate processing apparatus 10 according to an embodiment. In an example, the substrate processing apparatus 10 is configured as a film deposition apparatus that performs PEALD on a substrate, for example. The substrate processing apparatus 10 includes a chamber (reactor chamber) 12. In the chamber 12, a shower head 14 to which an RF power is applied is provided. A hole 14a through which gas can pass is formed in the shower head 14.

In the chamber 12, a susceptor 16 is provided to be opposed to the shower head 14. The susceptor 16 is supported by a sliding shaft 18. In an example, the sliding shaft 18 and the susceptor 16 are lifted and lowered by a motor 19. The shower head 14 and the susceptor 16 form a parallel plate structure. The thickness of a processing space 17, which is a gap between the shower head 14 and the susceptor 16, is adjusted by lifting and lowering the susceptor 16.

A gas supply part 22 is connected to the shower head 14 with an insulating component 20 disposed therebetween. The gas supply part 22 is a part for supplying a material gas to between the shower head 14 and the susceptor 16. The processing space 17 described above is a space in which a substrate placed on the susceptor 16 is subjected to film deposition or other processing.

An exhaust duct 30 is provided between the shower head 14 and the chamber 12. The exhaust duct 30 is made of ceramic, for example. An O-ring 32 appropriately compressed is provided between the exhaust duct 30 and the shower head 14. An O-ring 34 appropriately compressed is provided between the exhaust duct 30 and the chamber 12. In an example, the exhaust duct 30 is provided above a flow control ring 31 in an annular configuration in plan view.

The exhaust duct 30 is formed in an annular configuration in plan view to surround the susceptor 16. The exhaust duct 30 provides an annular flow path 30b that surrounds the processing space 17 above the susceptor 16. To guide gas from the processing space 17 to the annular flow path 30b, the flow control ring (FCR) 31 is provided. The FCR 31 is placed on the chamber 12 with an O-ring disposed therebetween, for example. The FCR 31 and the exhaust duct 30 provide a slit 30a, and the gas supplied to the processing space 17 is guided to the annular flow path 30b through the slit 30a. To discharge the gas in the annular flow path 30b to the outside, an exhaust port 30c is formed in the exhaust duct 30.

The exhaust port 30c is connected to gas exhaust part 40 provided on a side surface of the chamber 12, for example. The gas exhaust part 40 is provided to discharge the material gas used for the substrate processing. A valve 42 and a vacuum pump 44 are connected to the gas exhaust part 40. The pressure in the chamber 12 can be adjusted by adjusting the amount of the exhaust gas with the valve 42 and the vacuum pump 44.

Figure 2:
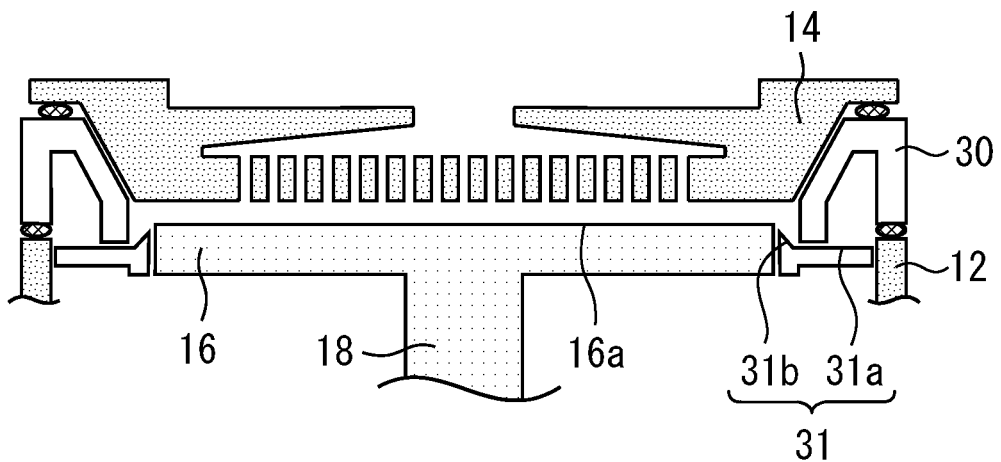
FIG. 2 is an enlarged view of the FCR and other components shown in FIG. 1.

FIG. 2 is an enlarged view of the FCR 31 and other components shown in FIG. 1. The FCR 31 includes a first top surface 31a and a second top surface 31b. In an example, the first top surface 31a is a flat surface, and the second top surface 31b is a sloped surface. The second top surface 31b is a surface at a higher level than the first top surface 31a. In the example shown in FIG. 2, the second top surface 31b is a sloped surface whose height decreases toward the first top surface 31a. In other words, the height of the second top surface 31b increases toward the susceptor 16. In the example shown in FIG. 2, the second top surface 31b is a planar surface.

Figure 3:
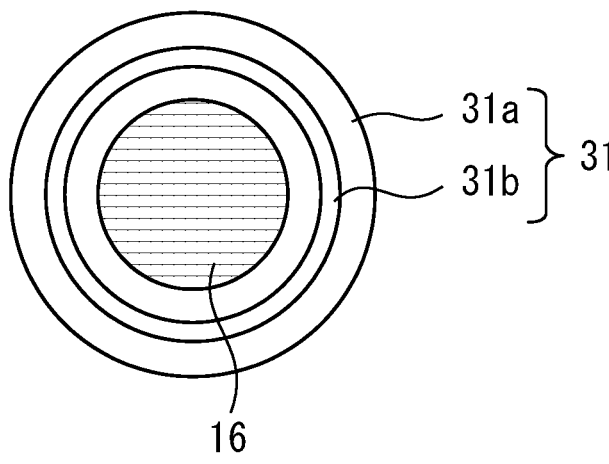
FIG. 3 is a plan view of the first top surface and the second top surface of the FCR.

FIG. 3 is a plan view of the first top surface and the second top surface of the FCR 31. The FCR 31 surrounds the susceptor 16. The second top surface 31b is an annular surface located closer to the inner edge of the FCR 31 than the first top surface 31a.

A substrate processing method using the substrate processing apparatus described above will be described. First, the motor 19 is activated to lift or lower the susceptor 16, thereby aligning the top surface of the susceptor 16 and the highest part of the second top surface 31b of the FCR 31 with each other. In this way, the height difference between the top surface of the susceptor 16 and the top surface of the FCR 31 is eliminated or reduced.

A substrate on the susceptor 16 is then subjected to a processing by supplying a gas to the processing space 17 through the slit 14a of the shower head 14 above the susceptor and at the same time applying a high-frequency power to the shower head 14. The processing is, for example, film deposition, etching or a plasma processing for improving the quality of a film.

In the substrate processing, the gas in the processing space 17 radially flows in plan view and is guided to the exhaust duct 30 by the flow control ring 31. Since the height difference between the top surface of the susceptor 16 and the top surface of the FCR 31 is eliminated or reduced, the formation of a significant vortex is reduced in the vicinity of the boundary between the susceptor 16 and the FCR 31.

Figure 4:
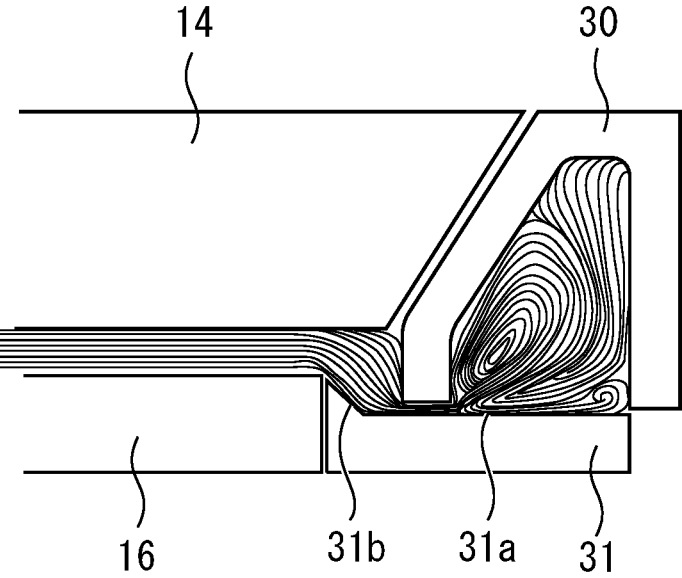
FIG. 4 is a diagram showing a simulation result of the gas flow.

FIG. 4 is a diagram showing a simulation result of the flow of gas. As a result of the provision of the second top surface 31b, the gas above the susceptor 16 flows to above the FCR 31 without passing over a height difference. In this way, the formation of a significant vortex is reduced in the vicinity of the boundary between the susceptor 16 and the FCR 31.

Figure 5:
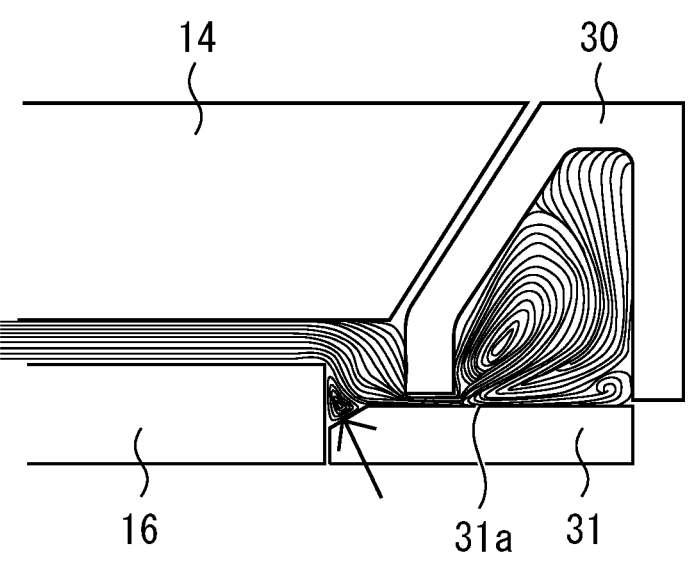
FIG. 5 is a diagram showing a simulation result for a substrate processing apparatus according to a comparative example.

FIG. 5 is a diagram showing a simulation result for a substrate processing apparatus according to a comparative example. The configuration of the FCR 31 in the comparative example differs from that of the FCR 31 of the substrate processing apparatus according to this embodiment in that there is no surface at a higher level than the first top surface 31a provided closer to the susceptor 16. In the example shown in FIG. 5, there is a surface at a lower level than the first top surface 31a between the first top surface 31a and the susceptor 16 as shown by an arrow in the drawing. Therefore, there is a height difference between the top surface of the susceptor 16 and the top surface of the FCR 31. In the substrate processing, a vortex occurs in the gas at the height difference. The vortex traps particles, which causes the contamination of the interior of the chamber. In an example, the vortex described above is likely to occur when the gap between the showerhead 14 and the susceptor 16 is less than 10.5 mm.

The simulations shown in FIGS. 4 and 5 are performed by flowing a seal gas upward at the gap between the susceptor and the FCR. The seal gas is a gas that is supplied to prevent the process gas from flowing to below the susceptor via the gap between the susceptor and the FCR. The seal gas is He, for example.

Figure 6:
FIG. 6 is a table showing the particle occurrence in the substrate processing according to four different recipes.
Figure 6:

FIG. 6 is a table showing the particle occurrence in the substrate processing according to four different recipes R1 to R4. The gap between the shower head and the susceptor is as narrow as 7.5 mm in recipes R1 and R3, while the gap is as wide as 10.5 mm in recipes R2 and R4. In FIG. 6, "Particle" shown above "R1" and "R3" indicates that significant particles occur under these conditions. The particle occurrence is shown in the wafer maps shown at the bottom of FIG. 6. This experimental result shows that the problem of particles is likely to arise when the gap between the shower head and the susceptor is small. The presence or absence of significant particles depends not only on the size of the gap between the shower head and the susceptor but also on other various factors such as gas flow rate. In general, however, particles become more likely to occur as the gap decreases. However, even with such small gap, the problem can be suppressed by reducing height difference between the top surface of the susceptor 16 and the top surface of the FCR 31.

Figure 7:
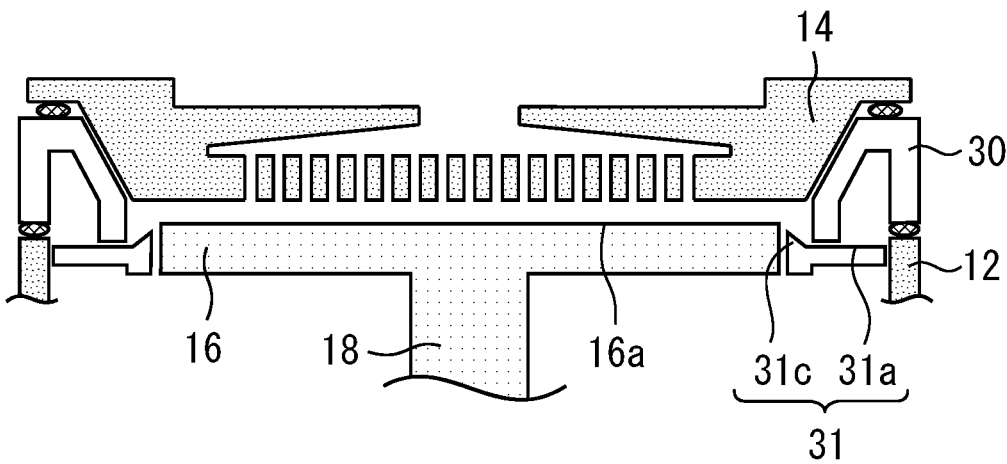
FIG. 7 is a partial cross-sectional view showing another example.

FIG. 7 is a partial cross-sectional view showing another example of the substrate processing apparatus. In this example, in the substrate processing, the height of the top surface of the susceptor 16 is not the same as the height of the highest part of the second top surface 31c. In this example, the top surface of the susceptor 16 is higher than the highest part of the second top surface 31c. However, since the FCR 31 has the second top surface 31c, the height difference between the susceptor and the FCR is smaller than when the FCR 31 does not have the second top surface 31c, so that the occurrence of a vortex in the vicinity of the gap between the susceptor and the FCR can be reduced.

Figure 8:
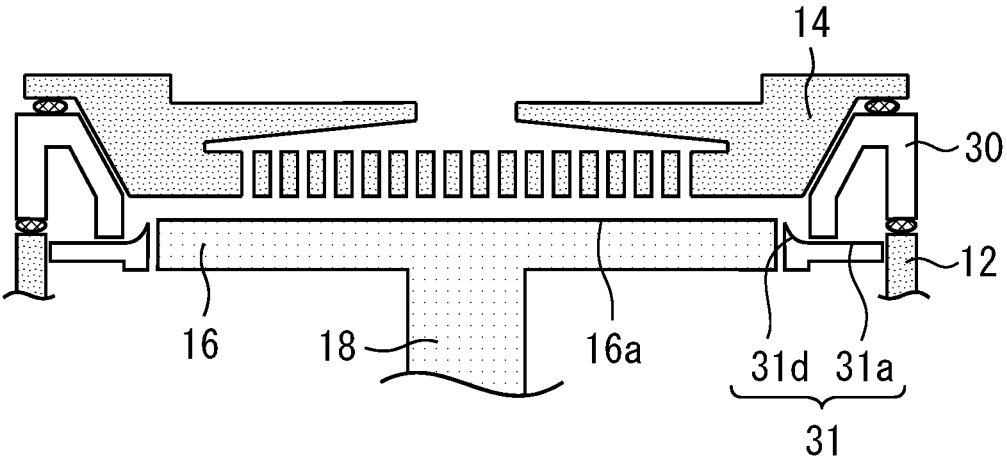
FIG. 8 is a partial cross-sectional view showing another example.

FIG. 8 is a partial cross-sectional view showing another example of the substrate processing apparatus. A second top surface 31d of the FCR 31 is a curved surface. The curved surface can reduce the friction of the gas used for the substrate processing that arises when the gas flows from above the susceptor 16 to above the FCR 31. The second top surface 31d having the curved shape contributes to reducing the occurrence of a vortex.

In all the examples described above, the occurrence of a vortex between the first top surface and the second top surface of the FCR can be reduced by connecting the first top surface and the second top surface without a height difference.

Figure 9:
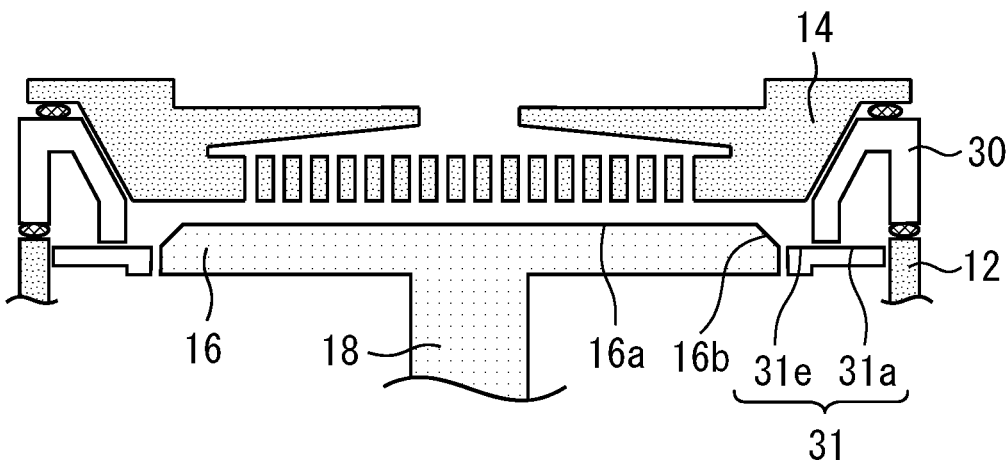
FIG. 9 is a partial cross-sectional view showing another example.

FIG. 9 is a partial cross-sectional view showing another example of the substrate processing apparatus. In this example, the top surface of the susceptor 16 includes a central top surface 16a, which forms a central part of the top surface of the susceptor 16, and a peripheral top surface 16b, which forms a peripheral part of the top surface of the susceptor 16. The peripheral top surface 16b is an annular part including the outer edge of the susceptor 16. The peripheral top surface 16b is an inclined surface whose height decreases toward the outer edge of the susceptor.

The FCR 31 has the first top surface 31a and a second top surface 31e. In this example, the height of the first top surface 31a and the height of the second top surface 31e are the same.

As shown in FIG. 9, a substrate is subjected to a processing in a state where the height of an outermost part of the peripheral top surface 16b and the height of the top surface of the FCR 31 are approximately the same. Therefore, gas flows over the susceptor 16 and the FCR 31 between which there is no height difference, so that the occurrence of a vortex in the vicinity of the gap between the susceptor 16 and the FCR 31 can be reduced.

Figure 10:
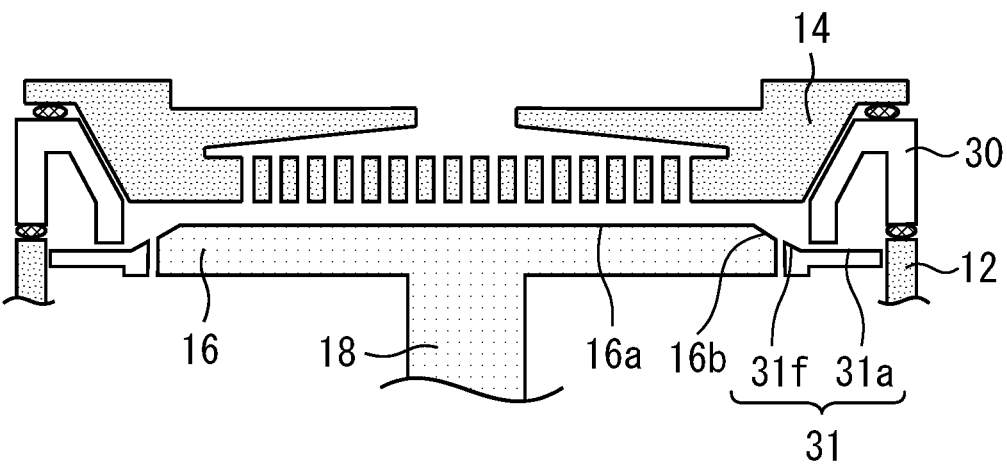
FIG. 10 is a partial cross-sectional view showing another example.

FIG. 10 is a partial cross-sectional view showing another example of the substrate processing apparatus. In this example, the susceptor has the peripheral top surface 16*b*, and the FCR 31 has a second top surface 31*f*. The peripheral top surface 16*b* and the second top surface 31*f* are connected without a height difference, and therefore, the occurrence of a vortex in the vicinity of the gap between the susceptor 16 and the FCR 31 can be reduced.

In the examples shown in FIGS. 9 and 10, the susceptor has a sloped surface. If not only the susceptor but also the FCR has a sloped surface, the effect of reducing the occurrence of a vortex can be increased. The sloped surface of the susceptor may be a planar surface or a curved surface.

The invention claimed is:

1. A substrate processing apparatus, comprising:
   a chamber;
   a susceptor provided in the chamber;
   a shower head provided above the susceptor;
   a flow control ring having a shape to surround the susceptor, the flow control ring having a first top surface and a second top surface, wherein the second top surface has an annular shape and is provided closer to an inner edge of the flow control ring than the first top surface at a higher level than the first top surface, the second top surface being a sloped surface whose height decreases toward and connects to the first top surface, wherein the second top surface, in a cross section of a vertical plane extending through a diameter of the flow control ring, comprises a curve connecting the inner edge of the flow control ring to the first top surface;
   an annular exhaust duct; and
   an annular slit formed between the flow control ring and the annular exhaust duct,
   wherein the slit is disposed below the annular exhaust duct,
   wherein the first top surface partially defines an annular flow path about the susceptor,
   wherein the first top surface is a planar surface, and
   wherein the first top surface partially defines the slit.

2. The substrate processing apparatus according to claim 1, wherein the first top surface is a horizontally planar surface.

3. The substrate processing apparatus according to claim 2, wherein the first top surface extends to an outer edge of the flow control ring.

4. The substrate processing apparatus of claim 3, wherein the outer edge of the flow control ring is connected to a chamber wall by an o-ring.

5. The substrate processing apparatus according to claim 1, wherein the curve is a concave curve.

6. The substrate processing apparatus according to claim 1, wherein the first top surface and the second top surface are connected without a height difference.

7. The substrate processing apparatus according to claim 1, wherein a height of a top surface of the susceptor and a height of a highest part of the second top surface nearest the susceptor are approximately the same.

8. The substrate processing apparatus according to claim 1,
   wherein the exhaust duct is provided above the flow control ring in an annular configuration in plan view.

9. The substrate processing apparatus according to claim 1, wherein an annular part including an outer edge of the top surface of the susceptor comprises an inclined surface whose height decreases toward the outer edge.

10. The substrate processing apparatus according to claim 9, wherein the annular part including the outer edge of the top surface of the susceptor further comprises a vertical surface aligned with a vertical surface of an inner perimeter of the flow control ring, thereby forming a gap between a processing space and a lower chamber portion.

11. The substrate processing apparatus according to claim 10, wherein a seal gas is within the gap.

12. The substrate processing apparatus according to claim 1, wherein the first top surface defines a bottom of the slit.

13. The substrate processing apparatus according to claim 1, wherein the first top surface defines a bottom of the annular flow path.

14. The substrate processing apparatus according to claim 1, wherein the flow control ring further comprises a first bottom surface and a second bottom surface, wherein a height of the first bottom surface is closer to a top surface of the susceptor than a height of the second bottom surface.

15. The substrate processing apparatus according to claim 1, further comprising a processing space disposed below the shower head and above the susceptor, wherein the annular exhaust provides an annular flow path, and wherein the slit fluidly connects the processing space to the annular flow path.

16. The substrate processing apparatus according to claim 15, wherein the first top surface comprises a first portion disposed under the slit and a second portion surrounding the first portion disposed under the annular flow path.

17. The substrate processing apparatus according to claim 1, wherein the annular exhaust duct comprises a ceramic.

18. The substrate processing apparatus according to claim 1, wherein the slit is disposed above the flow control ring.

19. The substrate processing apparatus according to claim 1, wherein the first top surface extends radially outward from the second top surface.

* * * * *